(12) United States Patent
Broyde et al.

(10) Patent No.: US 9,077,317 B2
(45) Date of Patent: Jul. 7, 2015

(54) METHOD AND APPARATUS FOR AUTOMATICALLY TUNING AN IMPEDANCE MATRIX, AND RADIO TRANSMITTER USING THIS APPARATUS

(71) Applicant: TEKCEM, Maule (FR)

(72) Inventors: Frédéric Broyde, Maule (FR); Evelyne Clavelier, Maule (FR)

(73) Assignee: TEKCEM, Maule (FR)

( * ) Notice: Subject to any disclaimer, the term of this patent is extended or adjusted under 35 U.S.C. 154(b) by 0 days.

(21) Appl. No.: 14/552,179

(22) Filed: Nov. 24, 2014

(65) Prior Publication Data

US 2015/0078485 A1 Mar. 19, 2015

Related U.S. Application Data

(63) Continuation of application No. PCT/IB2014/058933, filed on Feb. 12, 2014.

(30) Foreign Application Priority Data

Apr. 15, 2013 (FR) ...................................... 13 00878

(51) Int. Cl.
*H04L 25/03* (2006.01)
*H03H 11/30* (2006.01)
*H04B 1/04* (2006.01)

(52) U.S. Cl.
CPC .............. *H03H 11/30* (2013.01); *H04B 1/0475* (2013.01); *H04B 2001/045* (2013.01)

(58) Field of Classification Search
CPC ..... H04F 1/3247; H04F 1/324; H04L 27/368; H04B 1/00; H04B 5/00; H04B 7/022; H04B 7/0404

USPC ............ 375/297, 267; 330/84, 126, 147, 148; 455/273, 276.1

See application file for complete search history.

(56) References Cited

U.S. PATENT DOCUMENTS 2,523,791 A 9/1950 Vahle et al.
2,745,067 A 5/1956 True et al.
(Continued)

FOREIGN PATENT DOCUMENTS

FR 2996067 A1 3/2014
WO 2014049475 A2 4/2014

OTHER PUBLICATIONS

Search Report for French Patent Application No. 13/00878; Jan. 27, 2014.
(Continued)

*Primary Examiner* — Khai Tran
(74) *Attorney, Agent, or Firm* — Barnes & Thornburg LLP

(57) ABSTRACT

The invention relates to a method and an apparatus for automatically tuning an impedance matrix, for instance the impedance matrix seen by the power amplifiers of a radio transmitter using a plurality of antennas simultaneously, and to a radio transmitter using this apparatus. An apparatus for automatically tuning an impedance matrix has 4 user ports and 4 target ports, and comprises: 4 sensing units; a signal processing unit, the signal processing unit estimating real quantities depending on the impedance matrix presented by the user ports, using the sensing unit output signals obtained for 4 different excitations applied successively to the user ports; a multiple-input-port and multiple-output-port tuning unit comprising adjustable impedance devices; and a tuning control unit delivering tuning control signals to the multiple-input-port and multiple-output-port tuning unit, the reactance of each of the adjustable impedance devices being mainly determined by one or more of the tuning control signals.

18 Claims, 5 Drawing Sheets

(56) References Cited

U.S. PATENT DOCUMENTS

| | | |
|---|---|---|
| 3,443,231 A | 5/1969 | Roza |
| 4,356,458 A | 10/1982 | Armitage |
| 4,493,112 A | 1/1985 | Bruene |
| 5,225,847 A | 7/1993 | Roberts et al. |
| 7,940,119 B2 * | 5/2011 | Broyde et al. .................. 330/84 |
| 7,983,645 B2 * | 7/2011 | Broyde et al. ................ 455/273 |
| 8,072,285 B2 | 12/2011 | Spears et al. |
| 8,299,867 B2 | 10/2012 | McKinzie |

OTHER PUBLICATIONS

Search Report for International Application No. PCT/IB2014/058933; May 19, 2014.

* cited by examiner

METHOD AND APPARATUS FOR AUTOMATICALLY TUNING AN IMPEDANCE MATRIX, AND RADIO TRANSMITTER USING THIS APPARATUS

CROSS REFERENCE TO RELATED APPLICATIONS

This is a Continuation Application of PCT application No. PCT/IB2014/058933, filed 12 Feb. 2014, published in English under No. WO 2014/170766, which in turn claims priority to French patent application No. 13/00878 of 15 Apr. 2013, entitled "Procédé et appareil pour accorder automatiquement une matrice impédance, et émetteur radio utilisant cet appareil", both of which are incorporated herein by reference.

FIELD OF THE INVENTION

The invention relates to a method and an apparatus for automatically tuning an impedance matrix, for instance the impedance matrix seen by the power amplifiers of a radio transmitter using a plurality of antennas simultaneously. The invention also relates to a radio transmitter using this apparatus.

PRIOR ART

Tuning an impedance means obtaining that an impedance presented by an input port of a device approximates a wanted impedance, and simultaneously offering a lossless, or nearly lossless, transfer of power from the input port to an output port of the device, in a context where the impedance seen by the output port may vary. Thus, if a signal generator presenting an impedance equal to the complex conjugate of the wanted impedance is connected to the input port, it will deliver a maximum power to the input port, and the output port will deliver a power near this maximum power. In the present patent application, a device for tuning an impedance is referred to as a "single-input-port and single-output-port tuning unit". Two examples of a single-input-port and single-output-port tuning unit are presented in the prior art section of the French patent application number 12/02542 of 25 Sep. 2012, entitled "Appareil d→accord d'antenne pour un réseau d'antennes à accès multiple" and in the corresponding international application PCT/IB2013/058423 of 10 Sep. 2013, entitled "Antenna tuning apparatus for a multiport antenna array", where each of these examples is designated as an antenna tuning apparatus which could be used to tune a single antenna. A single-input-port and single-output-port tuning unit comprises one or more adjustable impedance devices each having an adjustable reactance. To tune the impedance, the reactances of the adjustable impedance devices must be adjusted as a function of the impedance seen by the output port.

Many methods and apparatuses for automatically tuning an impedance have been described, which use one or more real quantities depending on the impedance presented by the input port, these real quantities being processed to obtain "tuning control signals", the tuning control signals being used to control the reactances of the adjustable impedance devices of a single-input and single-output tuning unit.

For instance, in an apparatus for automatically tuning an impedance disclosed in the patent of the U.S. Pat. No. 2,523,791, entitled "Automatic Tuning System", in an apparatus for automatically tuning an impedance disclosed in the patent of the U.S. Pat. No. 2,745,067, entitled "Automatic Impedance Matching Apparatus", and in an apparatus for automatically tuning an impedance disclosed in the patent of the U.S. Pat. No. 3,443,231, entitled "Impedance Matching System", the wanted impedance is a resistance. We shall use $R_0$ to denote this resistance. In each of these apparatuses, a voltage v and a current i are sensed at a given point in a circuit, the impedance presented by the input port being $Z=v/i$. In each of these apparatuses, the real quantities depending on the impedance presented by the input port are a voltage determined by the phase of v relative to i, this phase being equal to the argument of Z, and a voltage substantially proportional to the difference $|v|-R_0|i|$. In each of these apparatuses, the second real quantity depending on the impedance presented by the input port is substantially equal to zero if the impedance presented by the input port is substantially equal to the wanted impedance, but the converse is not true. In the case of said U.S. Pat. No. 2,745,067 and U.S. Pat. No. 3,443,231, the two real quantities depending on the impedance presented by the input port are substantially equal to zero if and only if the impedance presented by the input port is substantially equal to the wanted impedance. In the case of said U.S. Pat. No. 3,443,231, two other real quantities representative of an impedance other than the impedance presented by the input port are also used to obtain the tuning control signals.

For instance, in an apparatus for automatically tuning an impedance disclosed in the patent of the U.S. Pat. No. 4,356,458, entitled "Automatic Impedance Matching Apparatus" and in an apparatus for automatically tuning an impedance disclosed in the patent of the U.S. Pat. No. 5,225,847 entitled "Automatic Antenna Tuning System", two voltages are sensed: a voltage substantially proportional to the absolute value of a complex incident voltage (an incident voltage is also referred to as forward voltage), and a voltage substantially proportional to the absolute value of a complex reflected voltage. Using the same notations as above, $v_F$ to denote the complex incident voltage, and $v_R$ to denote the complex reflected voltage, the specialist understands that said absolute values are given by $|v_F|=|v+R_0 i|/2$ and by $|v_R|=|v-R_0 i|/2$, respectively. In each of these apparatuses, a single real quantity depending on the impedance presented by the input port is used. It is a number processed in a digital circuit. In one of these apparatuses, this number is substantially equal to the ratio of the absolute value of the complex reflected voltage to the absolute value of the complex incident voltage, that is to say, to $|v_R|/|v_F|$. In the other of these apparatuses, this number is substantially equal to the squared inverse of this ratio, that is to say, to $|v_F|^2/|v_R|^2$.

For instance, in an apparatus for automatically tuning an impedance disclosed in the patent of the U.S. Pat. No. 4,493,112, entitled "Antenna Tuner Discriminator", two complex voltages are sensed: a voltage substantially proportional to an incident voltage, and a voltage substantially proportional to a reflected voltage. Using the incident voltage as reference for the phase, a voltage proportional to the real part of the reflected voltage and a voltage proportional to the imaginary part of the reflected voltage are obtained. In this apparatus, the real quantities depending on the impedance presented by the input port are the voltage proportional to the real part of the reflected voltage and the voltage proportional to the imaginary part of the reflected voltage. In this apparatus, the two real quantities depending on the impedance presented by the input port are substantially equal to zero if and only if the impedance presented by the input port is substantially equal to the wanted impedance.

We note that, in the apparatuses disclosed in said U.S. Pat. No. 4,356,458 and U.S. Pat. No. 5,225,847, a digital feedback loop involving sequential logic must be used to obtain the tuning control signals and tune the impedance presented by the input port, because the single real quantity depending on the impedance presented by the input port does not provide a full information on the impedance presented by the input port. In the other apparatuses considered above, a faster tuning can be obtained, because two real quantities depending on the impedance presented by the input port provide a full information on the impedance presented by the input port, so that a simple degenerative feedback loop can be used to obtain the tuning control signals and tune the impedance presented by the input port. However, the specialist understands that an apparatus for automatically tuning an impedance using two real quantities depending on the impedance presented by the input port, providing a full information on the impedance presented by the input port, could achieve the fastest tuning if, based on this full information obtained at a given time, it computes the values of the tuning control signals needed to obtain an exact tuning and quickly delivers the corresponding tuning control signals.

When the input port is intended to be coupled to the radio-frequency signal port of a wireless receiver or of a wireless transmitter, an apparatus for automatically tuning an impedance is sometimes referred to as "automatic antenna tuner" or as "adaptive impedance matching module", for instance in the patent of the U.S. Pat. No. 8,072,285, entitled "Method for tuning an adaptive impedance matching network with a look-up table", or in the patent of the U.S. Pat. No. 8,299,867, entitled "Adaptive impedance matching module". An apparatus for automatically tuning an impedance is indeed adaptive, in the sense that some circuit parameters, namely the reactances of adjustable impedance devices, are varied with time as a function of circuit variables such as sensed voltages or currents.

Tuning an impedance matrix means obtaining that an impedance matrix presented by a plurality of input ports of a device approximates a wanted impedance matrix, and simultaneously offering a lossless, or nearly lossless, transfer of power from the plurality of input ports to a plurality of output ports of the device, in a context where the impedance matrix seen by the plurality of output ports may vary. Thus, if the ports of a multiport signal generator presenting an impedance matrix equal to the hermitian adjoint (that is to say a matrix equal to the matrix transpose of the matrix complex conjugate) of the wanted impedance matrix are suitably connected to the plurality of input ports, said multiport signal generator delivers a maximum power to the plurality of input ports, and the plurality of output ports delivers a power near this maximum power. In the present patent application, a device for tuning an impedance matrix is referred to as a "multiple-input-port and multiple-output-port tuning unit". Examples of a multiple-input-port and multiple-output-port tuning unit are disclosed in said French patent application number 12/02542 and said corresponding international application PCT/IB2013/058423, each of these examples being designated as an "antenna tuning apparatus for a multiport antenna array". A multiple-input-port and multiple-output-port tuning unit comprises several adjustable impedance devices each having an adjustable reactance. To tune the impedance matrix, the reactances of the adjustable impedance devices must be adjusted as a function of the impedance matrix seen by the plurality of output ports.

The specialist understands that a plurality of apparatuses for automatically tuning an impedance can be used to automatically tune an impedance matrix, in the special case where the interactions between the ports of a multiport load coupled to their output ports are very small and where the wanted impedance matrix is diagonal. Unfortunately, there is no known solution to the problem of automatically tuning an impedance matrix, in the case where the interactions between the ports of a multiport load coupled to the output ports are not very small, that is to say in the case where the impedance matrix seen by the output ports is not substantially diagonal.

SUMMARY OF THE INVENTION

The purpose of the invention is a method and an apparatus for automatically tuning an impedance matrix, without the above-mentioned limitations of known techniques, and also a radio transmitter using this apparatus.

The method of the invention is a method for automatically tuning an impedance matrix presented, at a given frequency, by m ports of an apparatus, where m is an integer greater than or equal to 2, each of said m ports being referred to as "user port", the apparatus having said m user ports and n other ports, where n is an integer greater than or equal to 2, each of said n other ports being referred to as "target port", said impedance matrix being referred to as "the impedance matrix presented by the user ports" and denoted by $Z_U$, the apparatus allowing, at said given frequency, a transfer of power from the user ports to the target ports, the method comprising the steps of:

estimating q real quantities depending on the impedance matrix presented by the user ports, where q is an integer greater than or equal to m, using m or more different excitations applied successively to the user ports;

using said q real quantities depending on the impedance matrix presented by the user ports, to obtain "tuning control signals";

adjusting the impedance matrix presented by the user ports using a multiple-input-port and multiple-output-port tuning unit, the multiple-input-port and multiple-output-port tuning unit comprising p adjustable impedance devices, where p is an integer greater than or equal to 2m, each of the adjustable impedance devices having a reactance at said given frequency, the reactance of any one of the adjustable impedance devices having an influence on the impedance matrix presented by the user ports, the reactance of any one of the adjustable impedance devices being adjustable by electrical means;

applying each of the tuning control signals to one or more of the adjustable impedance devices, the reactance of each of the adjustable impedance devices being mainly determined by one or more of the tuning control signals.

According to the invention, the given frequency is for instance a frequency greater than or equal to 150 kHz. The specialist understands that the impedance matrix presented by the user ports is a complex matrix of size m×m. Said transfer of power from the user ports to the target ports may be a transfer of power with small or negligible or zero losses, this characteristic being preferred.

According to the invention, each of the m or more different excitations applied successively to the user ports may for instance comprise a sinusoidal signal at said given frequency, for instance a sinusoidal current at said given frequency applied to one and only one of the user ports, said one and only one of the user ports being a different user port for each of the m or more different excitations. However, this is not at all a characteristic of the invention. For instance, at least one of the m or more different excitations may comprise a sinusoidal signal at a frequency near to but different from the given frequency, or a non-sinusoidal signal. For instance, at least one of the m or more different excitations may comprise currents and/or voltages applied simultaneously to a plurality of user ports. The specialist understands which are the characteristics of the m or more different excitations which are necessary to accurately estimate the q real quantities depending on the impedance matrix presented by the user ports.

The specialist understands that, according to the invention, the tuning control signals are obtained after the m or more different excitations have been successively applied and the q real quantities depending on the impedance matrix presented by the user ports have been estimated. The specialist understands that this characteristic of the method of the invention cannot be obtained with the plurality of apparatuses for automatically tuning an impedance, used to tune an impedance matrix, as presented above in the prior art section. The specialist understands that this characteristic of the method of the invention avoids the interferences which wreak havoc on the operation of a plurality of apparatuses for automatically tuning an impedance, used to tune an impedance matrix, in the case where the interactions between the ports of a multiport load coupled to their output ports are not very small.

According to the invention, each of said q real quantities depending on the impedance matrix presented by the user ports may for instance be a real quantity representative of the impedance matrix presented by the user ports.

According to the invention, each of said q real quantities depending on the impedance matrix presented by the user ports may for instance be substantially proportional to the absolute value, or the phase, or the real part, or the imaginary part of an entry of the impedance matrix presented by the user ports, or of an entry of the inverse of the impedance matrix presented by the user ports (that is, the admittance matrix presented by the user ports), or of an entry of a matrix of the voltage reflection coefficients at the user ports, defined as being equal to $(Z_U-Z_O)(Z_U+Z_O)^{-1}$, where $Z_O$ is a reference impedance matrix.

The specialist understands that the tuning control signals determine the reactances of the adjustable impedance devices, so that they have an influence on the impedance matrix presented by the user ports. According to the invention, it is possible that the tuning control signals are such that the impedance matrix presented by the user ports decreases or minimizes a norm of the image of the impedance matrix presented by the user ports under a matrix function, the matrix function being a function from a set of square complex matrices into the same set of square complex matrices. For instance, this norm may be a vector norm or a matrix norm. For instance, if we define a wanted impedance matrix, the wanted impedance matrix being denoted by $Z_W$, said matrix function may be defined by $$f(Z_U)=Z_U-Z_W \quad (1)$$

in which case the image of $Z_U$ under the matrix function is a difference of impedance matrices, or by $$f(Z_U)=Z_U^{-1}-Z_W^{-1} \quad (2)$$

in which case the image of $Z_U$ under the matrix function is a difference of admittance matrices, or by $$f(Z_U)=(Z_U-Z_W)(Z_U+Z_W)^{-1} \quad (3)$$

in which case the image of $Z_U$ under the matrix function is a matrix of the voltage reflection coefficients at the user ports. We note that each of these matrix functions is such that $f(Z_W)$ is a null matrix, so that the norm of $f(Z_W)$ is zero.

An adjustable impedance device is a component comprising two terminals which substantially behave as a passive linear two-terminal circuit element, and which are consequently fully characterized by an impedance which may depend on frequency, this impedance being adjustable. An adjustable impedance device may be adjustable by mechanical means, for instance a variable resistor, a variable capacitor, a network comprising a plurality of capacitors and one or more switches or change-over switches used to cause different capacitors of the network to contribute to the reactance, a variable inductor, a network comprising a plurality of inductors and one or more switches or change-over switches used to cause different inductors of the network to contribute to the reactance, or a network comprising a plurality of open-circuited or short-circuited stubs and one or more switches or change-over switches used to cause different stubs of the network to contribute to the reactance. We note that all examples in this list, except the variable resistor, are intended to provide an adjustable reactance.

An adjustable impedance device having a reactance which is adjustable by electrical means may be such that it only provides, at said given frequency, a finite set of reactance values, this characteristic being for instance obtained if the adjustable impedance device is:

a network comprising a plurality of capacitors or open-circuited stubs and one or more electrically controlled switches or change-over switches, such as electro-mechanical relays, or microelectromechanical switches (MEMS switches), or PIN diodes or insulated-gate field-effect transistors (MOSFETs), used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at said given frequency, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

The method of the invention may be such that any diagonal entry of the impedance matrix presented by the user ports is influenced by the reactance of at least one of the adjustable impedance devices. The method of the invention may be such that the reactance of at least one of the adjustable impedance devices has an influence on at least one non-diagonal entry of the impedance matrix presented by the user ports. The specialist understands that this characteristic avoids the limited tuning capability of a plurality of apparatuses for automatically tuning an impedance, used to tune the impedance matrix of a plurality of ports, mentioned above in the prior art section. This question will be explored further in the discussion of the first and second embodiments.

An apparatus implementing the method of the invention is an apparatus for automatically tuning an impedance matrix presented, at a given frequency, by m ports of the apparatus, where m is an integer greater than or equal to 2, each of said m ports being referred to as "user port", the apparatus having said m user ports and n other ports, where n is an integer greater than or equal to 2, each of said n other ports being referred to as "target port", said impedance matrix being referred to as "the impedance matrix presented by the user ports" and denoted by $Z_U$, the apparatus allowing, at said given frequency, a transfer of power from the user ports to the target ports, the apparatus comprising:

at least m sensing units, each of the sensing units delivering one or more "sensing unit output signals", each of the sensing unit output signals being mainly determined by one or more electrical variables;

a signal processing unit, the signal processing unit estimating q real quantities depending on the impedance matrix presented by the user ports, where q is an integer greater than or equal to m, using the sensing unit output signals obtained for m or more different excitations applied successively to the user ports, the signal processing unit delivering a "tuning instruction" as a function of said q real quantities depending on the impedance matrix presented by the user ports;

a multiple-input-port and multiple-output-port tuning unit, the multiple-input-port and multiple-output-port tuning unit comprising p adjustable impedance devices, where p is an integer greater than or equal to 2m, each of the adjustable impedance devices having a reactance at said given frequency, the reactance of any one of the adjustable impedance devices having an influence on the impedance matrix presented by the user ports, the reactance of any one of the adjustable impedance devices being adjustable by electrical means;

a tuning control unit, the tuning control unit receiving the tuning instruction from the signal processing unit, the tuning control unit delivering "tuning control signals" to the multiple-input-port and multiple-output-port tuning unit, the tuning control signals being determined as a function of the tuning instruction, the reactance of each of the adjustable impedance devices being mainly determined by one or more of the tuning control signals.

For instance, each of said electrical variables may be a voltage, or an incident voltage, or a reflected voltage, or a current, or an incident current, or a reflected current. For instance, each of said electrical variables may be sensed at one of said user ports, or at one of said target ports, or at a port of the multiple-input-port and multiple-output-port tuning unit, or inside the multiple-input-port and multiple-output-port tuning unit.

Said multiple-input-port and multiple-output-port tuning unit comprises m input ports and n output ports. It is assumed that said multiple-input-port and multiple-output-port tuning unit behaves, at the given frequency, with respect to its input ports and output ports, substantially as a passive linear device. More precisely, said multiple-input-port and multiple-output-port tuning unit behaves, at the given frequency, with respect to the n output ports and the m input ports, substantially as a passive linear (n+m)-port device. As a consequence of linearity, it is possible to define "the impedance matrix presented by the input ports". As a consequence of passivity, the multiple-input-port and multiple-output-port tuning unit does not provide amplification.

It is possible that each of the m input ports of the multiple-input-port and multiple-output-port tuning unit is coupled, directly or indirectly, to one and only one of the m user ports, and that each of the m user ports is coupled, directly or indirectly, to one and only one of the m input ports of the multiple-input-port and multiple-output-port tuning unit. It is possible that each of the n output ports of the multiple-input-port and multiple-output-port tuning unit is coupled, directly or indirectly, to one and only one of the n target ports, and that each of the n target ports is coupled, directly or indirectly, to one and only one of the n output ports of the multiple-input-port and multiple-output-port tuning unit.

The specialist understands that:

the tuning of the impedance matrix presented by the user ports is mainly determined by the tuning control signals, each of the tuning control signals being determined as a function of said real quantities depending on the impedance matrix presented by the user ports;

the apparatus of the invention is adaptive in the sense that circuit parameters, namely the reactances of adjustable impedance devices, are varied with time as a function of the sensing unit output signals, which are each mainly determined by one or more electrical variables.

The specialist understands that the tuning instruction may for instance be determined as being a tuning instruction which, among a set of possible tuning instructions, produces an impedance matrix presented by the user ports which decreases or minimizes a norm of the image of the impedance matrix presented by the user ports under a matrix function, the matrix function being for instance one of the matrix functions f such that $f(Z_U)$ is given by the equation (1) or the equation (2) or the equation (3). The specialist also understands that the tuning instruction may for instance be determined as being a tuning instruction which provides an impedance matrix presented by the user ports which is substantially equal to the wanted impedance matrix, for instance a tuning instruction such that $Z_U = Z_W$.

The invention is also about a transmitter for radio communication using an apparatus for automatically tuning an impedance matrix. A transmitter for radio communication of the invention is a transmitter for radio communication with a plurality of antennas in a given frequency band, comprising:

n antenna output ports, where n is an integer greater than or equal to 2;

m power amplifiers, where m is an integer greater than or equal to 2, each of the power amplifiers having an output port, each of the power amplifiers being able to deliver a power in said given frequency band, a part of said power being transferred to the antenna output ports, the output ports of the power amplifiers seeing, at a frequency in said given frequency band, an impedance matrix referred to as "the impedance matrix seen by the output ports of the power amplifiers", the impedance matrix seen by the output ports of the power amplifiers being a complex matrix of size m×m;

at least m sensing units, each of the sensing units delivering one or more "sensing unit output signals", each of the sensing unit output signals being mainly determined by one or more electrical variables;

a signal processing unit, the signal processing unit estimating q real quantities depending on the impedance matrix seen by the output ports of the power amplifiers, where q is an integer greater than or equal to m, using the sensing unit output signals obtained for m or more different excitations applied successively by the power amplifiers at the output ports of the power amplifiers, the signal processing unit delivering a "tuning instruction" as a function of said q real quantities depending on the impedance matrix seen by the output ports of the power amplifiers;

a multiple-input-port and multiple-output-port tuning unit, the multiple-input-port and multiple-output-port tuning unit comprising p adjustable impedance devices, where p is an integer greater than or equal to 2m, each of the adjustable impedance devices having a reactance at said frequency in said given frequency band, the reactance of any one of the adjustable impedance devices having an influence on the impedance matrix seen by the output ports of the power amplifiers, the reactance of any one of the adjustable impedance devices being adjustable by electrical means;

a tuning control unit, the tuning control unit receiving the tuning instruction from the signal processing unit, the tuning control unit delivering "tuning control signals" to the multiple-input-port and multiple-output-port tuning unit, the tuning control signals being determined as a function of the tuning instruction, the reactance of each of the adjustable impedance devices being mainly determined by one or more of the tuning control signals.

Said multiple-input-port and multiple-output-port tuning unit of the transmitter for radio communication of the invention comprises m input ports and n output ports. It is possible that each of the m input ports of the multiple-input-port and multiple-output-port tuning unit is coupled, directly or indirectly, to one and only one of said output ports of the power amplifiers, and that each of said output ports of the power amplifiers is coupled, directly or indirectly, to one and only one of the m input ports of the multiple-input-port and multiple-output-port tuning unit. It is possible that each of the n output ports of the multiple-input-port and multiple-output-port tuning unit is coupled, directly or indirectly, to one and only one of the n antenna output ports, and that each of the n antenna output ports is coupled, directly or indirectly, to one and only one of the n output ports of the multiple-input-port and multiple-output-port tuning unit. Thus, a part of said power delivered by the power amplifiers can be transferred to the antenna output ports.

Said part of said power may be substantially equal to said power, this characteristic being preferred.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 1:
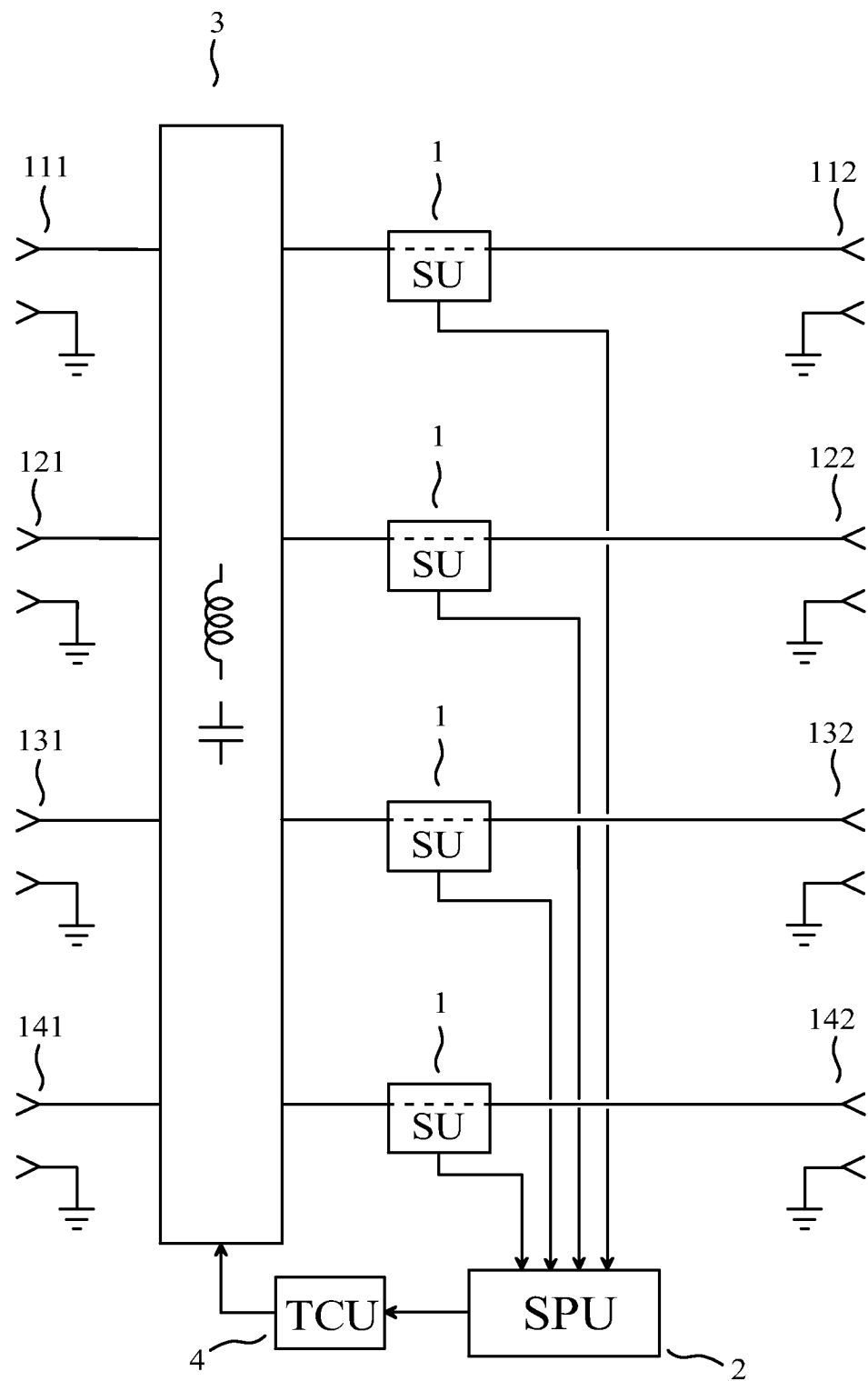
FIG. 1 shows the block diagram of an apparatus for automatically tuning an impedance matrix presented by 4 user ports (first embodiment)

As a first embodiment of a device of the invention, given by way of non-limiting example, we have represented in FIG. 1 the block diagram of an apparatus for automatically tuning an impedance matrix presented by m=4 user ports, at a given frequency greater than or equal to 30 MHz, the apparatus having said m user ports (112) (122) (132) (142) and n=4 target ports (111) (121) (131) (141), the impedance matrix being referred to as "the impedance matrix presented by the user ports" and denoted by $Z_U$, the apparatus comprising:

m sensing units (1), each of the sensing units delivering two "sensing unit output signals", each of the sensing unit output signals being determined by one electrical variable;

a signal processing unit (2), the signal processing unit estimating q real quantities depending on the impedance matrix presented by the user ports, where q is an integer greater than or equal to m, using the sensing unit output signals obtained for m different excitations applied successively to the user ports, the signal processing unit delivering a "tuning instruction" as a function of said q real quantities depending on the impedance matrix presented by the user ports;

a multiple-input-port and multiple-output-port tuning unit (3), the multiple-input-port and multiple-output-port tuning unit comprising p adjustable impedance devices, where p is an integer greater than or equal to 2m=8, each of the adjustable impedance devices having a reactance at said given frequency, the reactance of any one of the adjustable impedance devices being adjustable by electrical means;

a tuning control unit (4), the tuning control unit receiving the tuning instruction from the signal processing unit (2), the tuning control unit delivering "tuning control signals" to the multiple-input-port and multiple-output-port tuning unit (3), the tuning control signals being determined as a function of the tuning instruction, the reactance of each of the adjustable impedance devices being determined by one or more of the tuning control signals.

Each of the sensing units (1) may for instance be such that the two sensing unit output signals delivered by said each of the sensing units comprise: a first sensing unit output signal proportional to a first electrical variable, the first electrical variable being a voltage across one of the user ports; and a second sensing unit output signal proportional to a second electrical variable, the second electrical variable being a current flowing in said one of the user ports. Said voltage across one of the user ports may be a complex voltage and said current flowing in said one of the user ports may be a complex current. Alternatively, each of the sensing units (1) may for instance be such that the two sensing unit output signals delivered by said each of the sensing units comprise: a first sensing unit output signal proportional to a first electrical variable, the first electrical variable being an incident voltage (which may also be referred to as a complex forward voltage) at one of the user ports; and a second sensing unit output signal proportional to a second electrical variable, the second electrical variable being a reflected voltage at said one of the user ports. Said incident voltage at one of the user ports may be a complex incident voltage and said reflected voltage at said one of the user ports may be a complex reflected voltage.

Each of the electrical variables is substantially zero if no excitation is applied to any one of the user ports and if no excitation is applied to any one of the target ports.

An external device has m output ports, each of the output ports of the external device being coupled to one and only one of the user ports, each of the user ports being coupled to one and only one of the output ports of the external device. The external device is not shown in FIG. 1. The external device successively applies m different excitations to the user ports, and informs the signal processing unit (2) of this action. For instance, if the user ports are numbered from 1 to m, if the different excitations are numbered from 1 to m, and if j is an integer greater than or equal to 1 and less than or equal to m, the excitation number j may consist of a voltage applied to the user port number j and no voltage applied to the other user ports, or consist of a current applied to the user port number j and no current applied to the other user ports.

The specialist understands how the signal processing unit (2) can use the sensing unit output signals obtained for m different excitations applied successively to the user ports, to estimate q real quantities depending on the impedance matrix presented by the user ports. In this first embodiment, $q=2m^2$ and the q real quantities depending on the impedance matrix presented by the user ports fully determine the impedance matrix presented by the user ports. For instance, let us consider the case where the two sensing unit output signals of one of said sensing units are proportional to a complex voltage across one of the user ports and to a complex current flowing in said one of the user ports, respectively, and where the excitation number j consists of a current applied to the user port number j and no current applied to the other user ports, as explained above. The specialist understands that, in this case, for the excitation number j, all entries of the column j of $Z_U$ can be easily computed, so that all entries of $Z_U$ can be determined once the m different excitations have been applied. For instance, said q real quantities depending on the impedance matrix presented by the user ports may consist of $m^2$ real numbers each proportional to the real part of an entry of $Z_U$ and of $m^2$ real numbers each proportional to the imaginary part of an entry of $Z_U$. For instance, said q real quantities depending on the impedance matrix presented by the user ports may consist of $m^2$ real numbers each proportional to the absolute value of an entry of $Z_U$ and of $m^2$ real numbers each proportional to the argument of an entry of $Z_U$.

The tuning instruction may be of any type of digital message.

In this first embodiment, the tuning instruction is such that the impedance matrix presented by the user ports is substantially equal to a wanted impedance matrix given by $$Z_W = \begin{pmatrix} 50.0 & 0.0 & 0.0 & 0.0 \\ 0.0 & 50.0 & 0.0 & 0.0 \\ 0.0 & 0.0 & 50.0 & 0.0 \\ 0.0 & 0.0 & 0.0 & 50.0 \end{pmatrix} \Omega \quad (4)$$

Since, as explained above, the q real quantities depending on the impedance matrix presented by the user ports fully determine $Z_U$, the signal processing unit determines and delivers a tuning instruction such that the resulting tuning control signals produce a $Z_U$ such that a norm of $Z_U - Z_W$ is small or zero. The specialist understands how the tuning instruction can be determined. The operation of the signal processing unit is such that a tuning instruction is generated at the end of a tuning sequence, and is valid until a next tuning instruction is generated at the end of a next tuning sequence.

The external device also delivers "instructions of the external device" to the signal processing unit (2), said instructions of the external device informing the signal processing unit that one or more of said excitations have been applied, or are being applied, or will be applied. For instance, the external device may initiate a tuning sequence when it informs the signal processing unit that it will apply the excitation number 1 to the user ports. For instance, the signal processing unit may end the tuning sequence when, after the m different excitations have been applied, a tuning instruction has been delivered. Additionally, the external device provides other signals to the signal processing unit, and/or receives other signals from the signal processing unit. The electrical links needed to deliver said instructions of the external device and to carry such other signals are not shown in FIG. 1.

The target ports see, at said given frequency, an impedance matrix referred to as "the impedance matrix seen by the target ports" and denoted by $Z_A$. The impedance matrix seen by the target ports is a complex matrix of size n×n. The specialist understands that $Z_U$ depends on $Z_A$.

The multiple-input-port and multiple-output-port tuning unit (3) is an antenna tuning apparatus disclosed in said French patent application number 12/02542 and in said international application PCT/IB2013/058423. Thus, the multiple-input-port and multiple-output-port tuning unit is such that the reactance of any one of the adjustable impedance devices has, at said given frequency, if the impedance matrix seen by the target ports is equal to a given diagonal impedance matrix, an influence on the impedance matrix presented by the user ports, and such that the reactance of at least one of the adjustable impedance devices has, at said given frequency, if the impedance matrix seen by the target ports is equal to the given diagonal impedance matrix, an influence on at least one non-diagonal entry of the impedance matrix presented by the user ports. This must be interpreted as meaning: the multiple-input-port and multiple-output-port tuning unit is such that, at said given frequency, there exists a diagonal impedance matrix referred to as the given diagonal impedance matrix, the given diagonal impedance matrix being such that, if an impedance matrix seen by the target ports is equal to the given diagonal impedance matrix, then (a) the reactance of any one of the adjustable impedance devices has an influence on an impedance matrix presented by the user ports, and (b) the reactance of at least one of the adjustable impedance devices has an influence on at least one non-diagonal entry of the impedance matrix presented by the user ports.

Moreover, the multiple-input-port and multiple-output-port tuning unit (3) is such that, at said given frequency, if the impedance matrix seen by the target ports is equal to a given non-diagonal impedance matrix, a mapping associating the impedance matrix presented by the user ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives. This must be interpreted as meaning: the multiple-input-port and multiple-output-port tuning unit is such that, at said given frequency, there exists a non-diagonal impedance matrix referred to as the given non-diagonal impedance matrix, the given non-diagonal impedance matrix being such that, if an impedance matrix seen by the target ports is equal to the given non-diagonal impedance matrix, then a mapping associating an impedance matrix presented by the user ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives.

Thus, the specialist understands that any small variation in the impedance matrix seen by the target ports can be at least partially compensated with a new automatic adjustment of the adjustable impedance devices.

The characteristics of the multiple-input-port and multiple-output-port tuning unit (3) are such that the apparatus for automatically tuning an impedance matrix allows, at said given frequency, an almost lossless transfer of power from the user ports to the target ports, and an almost lossless transfer of power from the target ports to the user ports.

If the apparatus for automatically tuning an impedance matrix has each of its target ports coupled to one and only one of the ports of a multiport antenna array, the specialist understands that $Z_A$ depends on the frequency and on the electromagnetic characteristics of the volume surrounding the antennas. In particular, if the multiport antenna array is built in a portable transceiver, for instance a user equipment (UE) of an LTE wireless network, the body of the user has an effect on $Z_A$, and $Z_A$ depends on the position of the body of the user. This is referred to as "user interaction", or "hand effect" or "finger effect". The specialist understands that the apparatus for automatically tuning an impedance matrix may be used to compensate a variation in $Z_A$ caused by a variation in the frequency of operation, and/or to compensate the user interaction.

Second Embodiment (Best Mode)

The second embodiment of a device of the invention, given by way of non-limiting example and best mode of carrying out the invention, also corresponds to the apparatus for automatically tuning an impedance matrix presented by m=4 user ports shown in FIG. 1, and all explanations provided for the first embodiment are applicable to this second embodiment. Additionally, we have represented in FIG. 2 the multiple-input-port and multiple-output-port tuning unit (3) used in this second embodiment. This multiple-input-port and multiple-output-port tuning unit comprises:
  n=4 output ports (311) (321) (331) (341);
  m=4 input ports (312) (322) (332) (342);
  n adjustable impedance devices (301) each presenting a negative reactance and each being coupled in parallel with one of the output ports;
  n(n−1)/2 adjustable impedance devices (302) each presenting a negative reactance and each having a first terminal coupled to one of the output ports and a second terminal coupled to one of the output ports which is different from the output port to which the first terminal is coupled;
  n=m windings (303) each having a first terminal coupled to one of the output ports and a second terminal coupled to one of the input ports;
  m adjustable impedance devices (304) each presenting a negative reactance and each being coupled in parallel with one of the input ports;
  m(m−1)/2 adjustable impedance devices (305) each presenting a negative reactance and each having a first terminal coupled to one of the input ports and a second terminal coupled to one of the input ports which is different from the input port to which the first terminal is coupled.

As shown in FIG. 1, each of the output ports (311) (321) (331) (341) is directly coupled to one and only one of the target ports (111) (121) (131) (141), and each of the input ports (312) (322) (332) (342) is indirectly coupled to one and only one of the user ports (112) (122) (132) (142) through one of the sensing units (1). Thus, at said given frequency, the impedance matrix seen by the output ports is equal to the impedance matrix seen by the target ports. The sensing units are such that, at said given frequency, the impedance matrix presented by the input ports is close to the impedance matrix presented by the user ports.

It is possible that mutual induction exists between the windings (303). In this case, the inductance matrix of the windings is not a diagonal matrix.

Figure 2:
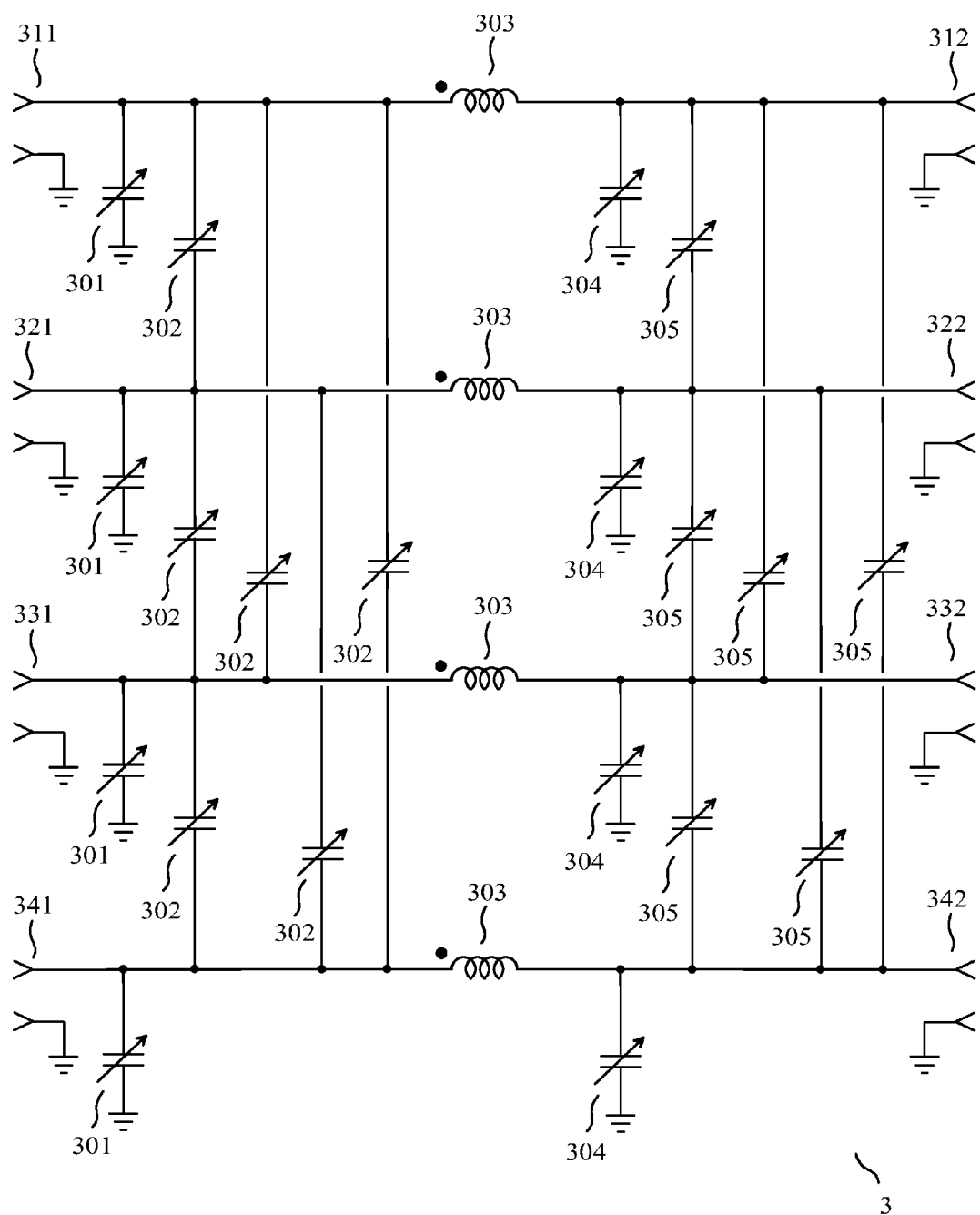
FIG. 2 shows a schematic diagram of a multiple-input-port and multiple-output-port tuning unit for simultaneously tuning 4 ports, which may be used in the apparatus for automatically tuning an impedance matrix shown in FIG. 1 (second embodiment)

All adjustable impedance devices (301) (302) (304) (305) are adjustable by electrical means, but the circuits and the control links needed to determine the reactance of each of the adjustable impedance devices are not shown in FIG. 2. In this second embodiment, we have n=m and we use p=m (m+1)= 20 adjustable impedance devices.

The specialist understands that, at a frequency at which the multiple-input-port and multiple-output-port tuning unit is intended to operate, if the impedance matrix seen by the target ports is a diagonal matrix having all its diagonal entries equal to 50Ω, the reactance of any one of the adjustable impedance devices has an influence on the impedance matrix presented by the user ports, and the reactance of one or more of the adjustable impedance devices has an influence on one or more of the non-diagonal entries of the impedance matrix presented by the user ports.

The impedance matrix seen by the target ports being a given symmetric complex matrix, it is possible to show that, for suitable component values, the p partial derivatives defined above are linearly independent in the real vector space of the complex matrices of size m×m, this vector space, denoted by E, being of dimension $2m^2$. Thus, the span of the p partial derivatives in E is a subspace of dimension p equal to the set of the symmetric complex matrices of size m×m. Here, any symmetric complex matrix of size m×m is an element of the span of the p partial derivatives. Consequently, any diagonal complex matrix of size m×m has the same diagonal entries as at least one element of the span of the p partial derivatives.

The reactance of an adjustable impedance device may depend on the ambient temperature, for some types of adjustable impedance devices. If such a type of adjustable impedance device is used in the multiple-input-port and multiple-output-port tuning unit, it is desirable that the tuning control signals are determined as a function of the tuning instruction and as a function of temperature, to compensate the effect of temperature on the reactance of each of the adjustable impedance devices.

The specialist understands that, if the impedance matrix seen by the target ports is symmetric, any small variation in the impedance matrix seen by the target ports can be compensated with a new adjustment of the adjustable impedance devices. Thus, it is always possible to obtain that $Z_U$ approximates $Z_W$.

In this second embodiment, an adaptive process is implemented by the signal processing unit, during one or more tuning sequences. A first possible adaptive process is the following: during each of said tuning sequences, the signal processing unit estimates the real part and the imaginary part of the $m^2$ entries of $Z_U$, which are $q=2m^2$ real quantities depending on the impedance matrix presented by the user ports; the signal processing unit computes the real part and the imaginary part of the $m^2$ entries of the admittance matrix presented by the user ports, which is equal to $Z_U^{-1}$; and the signal processing unit determines a tuning instruction such that a norm of the image of this admittance matrix, computed as said above, under a matrix function is reduced (so that we can also say that a norm of the image of $Z_U$ under a matrix function is reduced). A second possible adaptive process is the following: during each of said tuning sequences, the signal processing unit estimates the real part and the imaginary part of the $m^2$ entries of the admittance matrix presented by the user ports, which are $q=2m^2$ real quantities depending on the impedance matrix presented by the user ports; and the signal processing unit determines a tuning instruction such that a norm of the image of this admittance matrix, estimated as said above, under a matrix function is reduced (so that we can also say that a norm of the image of $Z_U$ under a matrix function is reduced). A third possible adaptive process is the following: during each of said tuning sequences, the signal processing unit estimates the real part and the imaginary part of the $m^2$ entries of the admittance matrix presented by the user ports ; and the signal processing unit determines a tuning instruction such that the admittance matrix presented by the user ports is substantially equal to a wanted admittance matrix equal to the inverse of $Z_W$.

The specialist understands that, in many possible applications, the impedance matrix seen by the target ports is a symmetric matrix, so that the impedance matrix presented by the user ports and the admittance matrix presented by the user ports are symmetric matrices which are each fully defined by $m(m+1)$ real quantities. Thus, only $m(m+1)$ real quantities depending on the impedance matrix presented by the user ports are needed to fully define the impedance matrix presented by the user ports and the admittance matrix presented by the user ports. The specialist understands how the three possible adaptive processes defined above can use this property and/or be modified to take advantage of this property.

The specialist understands the advantage of using the real part and the imaginary part of the entries of the admittance matrix presented by the user ports, which is related to the fact that the reactances of the adjustable impedance devices (304) (305) each having a terminal coupled to one of the input ports have no influence on the real part of the admittance matrix presented by the user ports. Thus, it is possible to first determine a variation of the reactances of the m(m+1)/2 adjustable impedance devices (301) (302) each having a terminal coupled to one of the output ports, to decrease or minimize a norm of the image of the real part of $Z_U^{-1}$ under a matrix function; and then to determine a variation of the reactances of the m (m+1)/2 adjustable impedance devices (304) (305) each having a terminal coupled to one of the input ports, to decrease or minimize a norm of the image of the imaginary part of $Z_U^{-1}$ under a matrix function. The specialist understands why this approach is advantageous to determine a tuning instruction.

The specialist understands that, if the impedance matrix seen by the target ports is a symmetric matrix, any small variation in the impedance matrix seen by the target ports can be automatically compensated. Thus, it is always possible to automatically and exactly tune the impedance matrix presented by the user ports.

Third Embodiment

Figure 3:
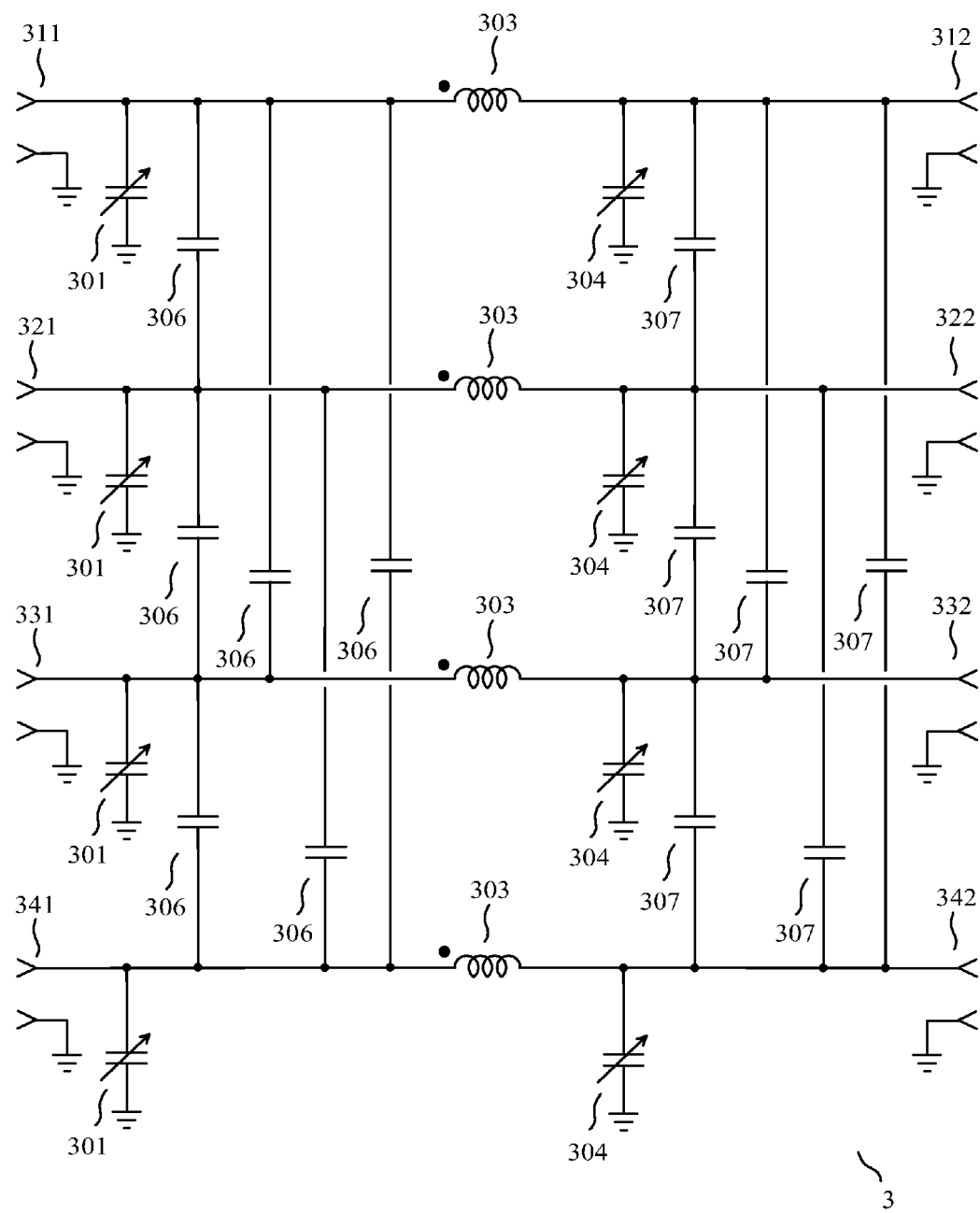
FIG. 3 shows a schematic diagram of a multiple-input-port and multiple-output-port tuning unit for simultaneously tuning 4 ports, which may be used in the apparatus for automatically tuning an impedance matrix shown in FIG. 1 (third embodiment)

The third embodiment of a device of the invention, given by way of non-limiting example, also corresponds to the apparatus for automatically tuning an impedance matrix presented by m=4 user ports shown in FIG. 1, and all explanations provided for the first embodiment are applicable to this third embodiment. Additionally, we have represented in FIG. 3 the multiple-input-port and multiple-output-port tuning unit (3) used in this third embodiment. This multiple-input-port and multiple-output-port tuning unit comprises:

n=4 output ports (311) (321) (331) (341);
m=4 input ports (312) (322) (332) (342);
n adjustable impedance devices (301) each presenting a negative reactance and each being coupled in parallel with one of the output ports;
n(n−1)/2 capacitors (306) each having a first terminal coupled to one of the output ports and a second terminal coupled to one of the output ports which is different from the output port to which the first terminal is coupled;
n=m windings (303) each having a first terminal coupled to one of the output ports and a second terminal coupled to one of the input ports;
m adjustable impedance devices (304) each presenting a negative reactance and each being coupled in parallel with one of the input ports;
m(m−1)/2 capacitors (307) each having a first terminal coupled to one of the input ports and a second terminal coupled to one of the input ports which is different from the input port to which the first terminal is coupled.

As shown in FIG. 1, each of the output ports (311) (321) (331) (341) is directly coupled to one and only one of the target ports (111) (121) (131) (141), and each of the input ports (312) (322) (332) (342) is indirectly coupled to one and only one of the user ports (112) (122) (132) (142) through one of the sensing units (1). Thus, at said given frequency, the impedance matrix seen by the output ports is equal to the impedance matrix seen by the target ports. The sensing units are such that, at said given frequency, the impedance matrix presented by the input ports is close to the impedance matrix presented by the user ports.

It is possible that mutual induction exists between the windings (303). In this case, the inductance matrix of the windings is not a diagonal matrix. All adjustable impedance devices (301) (304) are adjustable by electrical means, but the circuits and the control links needed to determine the reactance of each of the adjustable impedance devices are not shown in FIG. 3.

The specialist understands that, at a frequency at which the multiple-input-port and multiple-output-port tuning unit is intended to operate, if the impedance matrix seen by the target ports is a diagonal matrix having all its diagonal entries equal to 50Ω, the reactance of any one of the adjustable impedance devices has an influence on $Z_U$, and the reactance of one or more of the adjustable impedance devices has an influence on one or more of the non-diagonal entries of $Z_U$. For suitable component values, it is possible to show that the p=8 partial derivatives defined above are linearly independent in the real vector space of dimension 32 of the complex matrices of size 4×4, denoted by E. Thus, the span of the p partial derivatives in E is of dimension 8. It is also possible to show that any diagonal complex matrix of size m×m has the same diagonal entries as at least one element of the span of the p partial derivatives.

In this third embodiment, an adaptive process is implemented by the signal processing unit, during one or more tuning sequences. The adaptive process is the following: during each of said tuning sequences, the signal processing unit estimates a norm of the matrix of the voltage reflection coefficients at the user ports, for a finite set of tuning instructions, and a tuning instruction producing the smallest norm is selected. The specialist understands that this adaptive process involves much less computations than the adaptive processes considered in the second embodiment. The specialist understands that the adaptive process of this third embodiment is very simple in the case where each of the sensing units is such that the two sensing unit output signals delivered by said each of the sensing units comprise: a first sensing unit output signal proportional to an incident voltage at one of the user ports; and a second sensing unit output signal proportional to a reflected voltage at said one of the user ports.

The specialist understands that any small variation in the impedance matrix seen by the target ports can be partially compensated with a new adjustment of the adjustable impedance devices, the compensation being automatic and usually better in the case where the impedance matrix seen by the target ports and the wanted impedance matrix are symmetric matrices. Thus, it is always possible to automatically and approximately tune the impedance matrix presented by the user ports.

If the capacitors (306) (307) have a value equal to 0 pF (or are not present in the circuit shown in FIG. 3), and if mutual induction does not exist between the windings (303), we see that the multiple-input-port and multiple-output-port tuning unit (3) is in fact composed of 4 single-input-port and single-output-port tuning units, these single-input-port and single-output-port tuning units being independent and uncoupled. More generally, an apparatus for automatically tuning an impedance matrix presented by m user ports, the apparatus having said m user ports and n target ports, may, in the case n=m, be such that the multiple-input-port and multiple-output-port tuning unit is composed of n single-input-port and single-output-port tuning units, these single-input-port and single-output-port tuning units being independent and uncoupled.

In this case, the method of the invention may become a method for automatically tuning an impedance matrix presented, at a given frequency, by n ports of an apparatus, where n is an integer greater than or equal to 2, each of said n ports being referred to as "user port", the apparatus having said n user ports and n other ports, each of said n other ports being referred to as "target port", said impedance matrix being referred to as "the impedance matrix presented by the user ports" and denoted by $Z_U$, the apparatus allowing, at said given frequency, a transfer of power from the user ports to the target ports, the method comprising the steps of:
  estimating q real quantities depending on the impedance matrix presented by the user ports, where q is an integer greater than or equal to n, using n or more different excitations applied successively to the user ports;
  using said q real quantities depending on the impedance matrix presented by the user ports, to obtain "tuning control signals";
  adjusting the impedance matrix presented by the user ports using n single-input-port and single-output-port tuning units, each of said single-input-port and single-output-port tuning units comprising two or more adjustable impedance devices, each of the adjustable impedance devices of said each of said single-input-port and single-output-port tuning units having a reactance at said given frequency, the reactance of any one of the adjustable impedance devices having an influence on the impedance matrix presented by the user ports, the reactance of any one of the adjustable impedance devices being adjustable by electrical means;
  applying each of the tuning control signals to one or more of the adjustable impedance devices, the reactance of each of the adjustable impedance devices being mainly determined by one or more of the tuning control signals.

An apparatus implementing this method is an apparatus for automatically tuning an impedance matrix presented, at a given frequency, by n ports of the apparatus, where n is an integer greater than or equal to 2, each of said n ports being referred to as "user port", the apparatus having said n user ports and n other ports, each of said n other ports being referred to as "target port", said impedance matrix being referred to as "the impedance matrix presented by the user ports" and denoted by $Z_U$, the apparatus allowing, at said given frequency, a transfer of power from the user ports to the target ports, the apparatus comprising:
  at least n sensing units, each of the sensing units delivering one or more "sensing unit output signals", each of the sensing unit output signals being mainly determined by one or more electrical variables;
  a signal processing unit, the signal processing unit estimating q real quantities depending on the impedance matrix presented by the user ports, where q is an integer greater than or equal to n, using the sensing unit output signals obtained for n or more different excitations applied successively to the user ports, the signal processing unit delivering a "tuning instruction" as a function of said q real quantities depending on the impedance matrix presented by the user ports;
  n single-input-port and single-output-port tuning units, each of said single-input-port and single-output-port tuning units comprising two or more adjustable impedance devices, each of the adjustable impedance devices of said each of said single-input-port and single-output-port tuning units having a reactance at said given frequency, the reactance of any one of the adjustable impedance devices having an influence on the impedance matrix presented by the user ports, the reactance of any one of the adjustable impedance devices being adjustable by electrical means;
  a tuning control unit, the tuning control unit receiving the tuning instruction from the signal processing unit, the tuning control unit delivering "tuning control signals" to the single-input-port and single-output-port tuning units, the tuning control signals being determined as a function of the tuning instruction, the reactance of each of the adjustable impedance devices being mainly determined by one or more of the tuning control signals.

Fourth Embodiment

Figure 4:
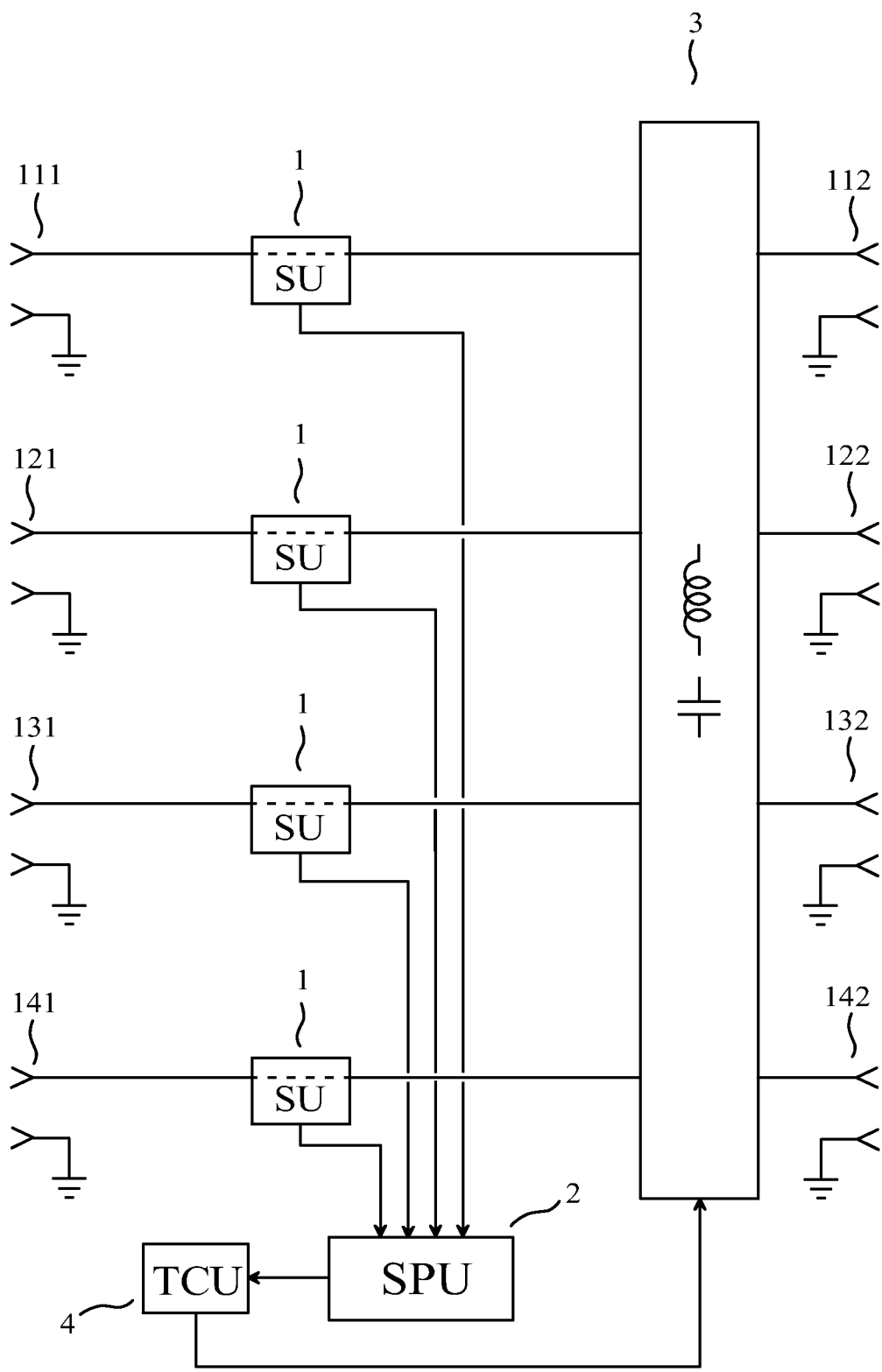
FIG. 4 shows the block diagram of an apparatus for automatically tuning an impedance matrix presented by 4 user ports (fourth embodiment)

As a fourth embodiment of a device of the invention, given by way of non-limiting example, we have represented in FIG. 4 the block diagram of an apparatus for automatically tuning an impedance matrix presented by m=4 user ports, at a given frequency greater than or equal to 300 MHz, the apparatus having said m user ports (112) (122) (132) (142) and n=4 target ports (111) (121) (131) (141), the impedance matrix being referred to as "the impedance matrix presented by the user ports", the apparatus comprising:
  m sensing units (1), each of the sensing units delivering two "sensing unit output signals", each of the sensing unit output signals being determined by one electrical variable;
  a signal processing unit (2), the signal processing unit estimating q real quantities depending on the impedance matrix presented by the user ports, where q is an integer greater than or equal to m, using the sensing unit output signals obtained for m different excitations applied successively to the user ports, the signal processing unit delivering a "tuning instruction" as a function of said q real quantities depending on the impedance matrix presented by the user ports;
  a multiple-input-port and multiple-output-port tuning unit (3), the multiple-input-port and multiple-output-port tuning unit comprising p adjustable impedance devices, where p is an integer greater than or equal to 2m=8, each of the adjustable impedance devices having a reactance at said given frequency, the reactance of any one of the adjustable impedance devices being adjustable by electrical means;
  a tuning control unit (4), the tuning control unit receiving the tuning instruction from the signal processing unit (2), the tuning control unit delivering "tuning control signals" to the multiple-input-port and multiple-output-port tuning unit (3), the tuning control signals being determined as a function of the tuning instruction, the reactance of each of the adjustable impedance devices being determined by one and only one of the tuning control signals.

Each of the sensing units (1) may for instance be such that the two sensing unit output signals delivered by said each of the sensing units comprise: a first sensing unit output signal proportional to a first electrical variable, the first electrical variable being a voltage across one of the target ports; and a second sensing unit output signal proportional to a second electrical variable, the second electrical variable being a current flowing in said one of the target ports. Said voltage across one of the target ports may be a complex voltage and said current flowing in said one of the target ports may be a complex current. Alternatively, each of the sensing units (1) may for instance be such that the two sensing unit output signals delivered by said each of the sensing units comprise: a first sensing unit output signal proportional to a first electrical variable, the first electrical variable being an incident voltage at one of the target ports; and a second sensing unit output signal proportional to a second electrical variable, the second electrical variable being a reflected voltage at said one of the target ports. Said incident voltage at one of the target ports may be a complex incident voltage and said reflected voltage at said one of the target ports may be a complex reflected voltage.

The specialist understands the consequences of the fact that, in this fourth embodiment, the sensing unit output signals are determined by electrical variables measured at the target ports, whereas, in the first embodiment, the sensing unit output signals are determined by electrical variables measured at the user ports. The specialist understands how, taking this fact into account, the signal processing unit can use the sensing unit output signals obtained for m different excitations applied successively to the user ports, to estimate q real quantities depending on the impedance matrix presented by the user ports. A consequence of this fact is for instance that, in this fourth embodiment, particular computations are needed to derive real quantities representative of the impedance matrix presented by the user ports. For instance, such particular computations may require the knowledge of the reactance of each of the adjustable impedance devices, corresponding to a tuning instruction which was valid when the electrical variables were measured at the target ports. The specialist notes that, in said patent of the U.S. Pat. No. 8,299,867, a single sensing unit output signal is determined by an electrical variable measured at a single target port.

An external device has m output ports, each of the output ports of the external device being coupled to one and only one of the user ports, each of the user ports being coupled to one and only one of the output ports of the external device. The external device is not shown in FIG. 4. The external device successively applies m different excitations to the user ports. The external device also delivers "instructions of the external device" to the signal processing unit (2), said instructions of the external device informing the signal processing unit that one or more of said excitations have been applied, or are being applied, or will be applied. Additionally, the external device provides other signals to the signal processing unit, and/or receives other signals from the signal processing unit. The electrical links needed to deliver said instructions of the external device and to carry such other signals are not shown in FIG. 4.

In this fourth embodiment, an adaptive process is carried out by the signal processing unit, during one or more tuning sequences. The adaptive process is the following: during each of said tuning sequences, the signal processing unit estimates the real part and the imaginary part of the impedance matrix presented by the user ports, and uses a lookup table (also spelled "look-up table") to determine a tuning instruction. The specialist understands how to build and use such a lookup table.

Fifth Embodiment

Figure 5:
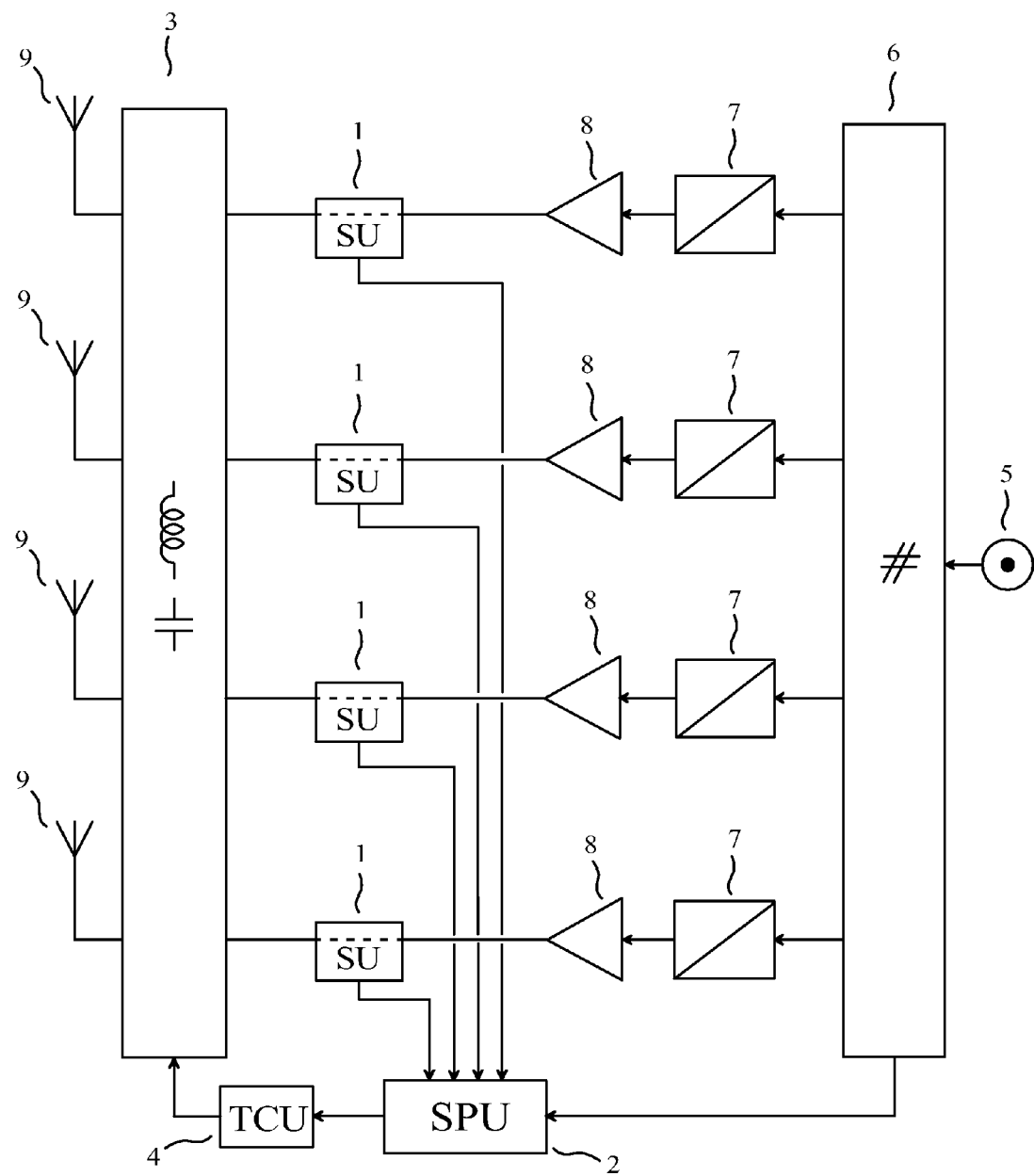
FIG. 5 shows the block diagram of a transmitter for radio communication using several antennas and the apparatus for automatically tuning an impedance matrix shown in FIG. 1 (fifth embodiment).

As a fifth embodiment of a device of the invention, given by way of non-limiting example, we have represented in FIG. 5 the block diagram of a transmitter for radio communication using an apparatus for automatically tuning an impedance matrix of the invention. The transmitter for radio communication shown in FIG. 5 is a transmitter for radio communication with multiple antennas in a given frequency band, comprising:

n=4 antenna output ports, each of the antenna output ports being coupled to an antenna (9);

a multiple-output signal processing device (6) processing a signal delivered by a source (5), the multiple-output signal processing device having m=4 signal outputs, each of the signal outputs delivering a digital signal when said each of the signal outputs is active, the multiple-output signal processing device delivering "tuning sequence instructions" which indicate when a tuning sequence is being performed and when an excitation is being applied during a tuning sequence, one and only one of the signal outputs being active during an excitation, a tuning sequence comprising m or more different excitations applied successively;

m conversion and analog processing circuits (7), each of the signal outputs of the multiple-output signal processing device (6) being coupled to an input of one of the conversion and analog processing circuits, each of the conversion and analog processing circuits having an output which delivers an analog signal in said given frequency band;

m power amplifiers (8), each of the power amplifiers having an input which is coupled to the output of one of the conversion and analog processing circuits (7), each of the power amplifiers having an output port, the power amplifiers delivering said excitations at the output ports of the power amplifiers, the impedance matrix seen, at a frequency in said given frequency band, by the output ports of the power amplifiers being referred to as "the impedance matrix seen by the output ports of the power amplifiers";

m sensing units (1), each of the sensing units delivering one or more "sensing unit output signals", each of the sensing unit output signals being determined by one or more electrical variables;

a signal processing unit (2), the signal processing unit estimating q real quantities depending on the impedance matrix seen by the output ports of the power amplifiers, where q is an integer greater than or equal to m, using the tuning sequence instructions and the sensing unit output signals obtained for the different excitations of a training sequence, the signal processing unit delivering a "tuning instruction" as a function of said q real quantities depending on the impedance matrix seen by the output ports of the power amplifiers;

a multiple-input-port and multiple-output-port tuning unit (3), which is identical to the one used in the second embodiment, each of the output ports of the multiple-input-port and multiple-output-port tuning unit being coupled to one and only one of the antennas through one of the antenna output ports, each of the input ports of the multiple-input-port and multiple-output-port tuning unit being coupled to one and only one of the output ports of the power amplifiers through one of the sensing units;

a tuning control unit (4), which is identical to the one used in the second embodiment.

The specialist understands that the "antenna output ports" of this fifth embodiment correspond to the "target ports" of the first embodiment, and that "the impedance matrix seen by the output ports of the power amplifiers" of this fifth embodiment corresponds to "the impedance matrix presented by the user ports" of the first embodiment.

In this fifth embodiment, during each of said excitations, one and only one of the power amplifiers delivers a sinusoidal current and presents a known impedance at its output port, each of the other power amplifiers delivering no current and presenting a high impedance at its output port. The short-circuit current of the Norton equivalent circuit of the output port of said one and only one of the power amplifiers is also known. Thus, the specialist understands that the measurement of complex voltages at the output ports of the power amplifiers, for the different excitations, is sufficient to derive all entries of the impedance matrix seen by the output ports of the power amplifiers. Consequently, each of the sensing units (1) may for instance deliver a single sensing unit output signal proportional to an electrical variable, the electrical variable being a voltage across one of the output ports of the power amplifiers, said voltage being a complex voltage.

The specialist understands that the sinusoidal current may be a modulated sinusoidal current. For instance, if the transmitter for radio communication is built in a user equipment of an LTE cellular wireless network, the modulated sinusoidal current delivered during one of said excitations may correspond to a transmission using a configuration "open-loop UE transmit antenna selection", which is well known to specialists, for which it is possible to use only one of said power amplifiers at a given time, this power amplifier being not specified.

The specialist understands that any small variation in the impedance matrix of the multiport antenna array formed by the antennas, caused by a change in operating frequency or a change in the medium surrounding the antennas, for instance due to user interaction, can be compensated with an automatic adjustment of the adjustable impedance devices, to obtain that the impedance matrix seen by the output ports of the power amplifiers remains close to a wanted impedance matrix, for instance the wanted impedance matrix given by the equation (4). Thus, it is always possible to obtain the best performance from the transmitter for radio communication with multiple antennas.

INDICATIONS ON INDUSTRIAL APPLICATIONS

The method and the apparatus of the invention are suitable for automatically tuning the impedance matrix seen by the radio-frequency signal input ports of a radio receiver using a plurality of antennas simultaneously, or seen by the radio-frequency signal output ports of a radio transmitter using a plurality of antennas simultaneously. In such applications, each target port of the apparatus of the invention may be coupled to an antenna, and each user port of the apparatus of the invention may be coupled to one of the radio-frequency signal input ports of the radio receiver using a plurality of antennas simultaneously, or to one of the radio-frequency signal output ports of a radio transmitter using a plurality of antennas simultaneously. Thus, the method and the apparatus of the invention are suitable for MIMO radio communication.

The radio transmitter of the invention is also suitable for MIMO radio communication.

The radio transmitter of the invention provides the best possible characteristics using very close antennas, hence presenting a strong interaction between the antennas. The invention is therefore particularly suitable for mobile radio transmitters, for instance those used in portable radiotelephones or portable computers.

The radio transmitter of the invention provides the best possible characteristics using a very large number of antennas in a given volume, hence presenting a strong interaction between the antennas. The invention is therefore particularly suitable for high-performance radio transmitters, for instance those used in the fixed stations of cellular radiotelephony networks.

A radio transmitter of the invention may be used in a device which also comprises a radio receiver having one or more parts in common with the radio transmitter of the invention. For instance, antennas and/or a multiple-input-port and multiple-output-port tuning unit used in a radio transmitter of the invention may also be a part of a radio receiver.

The invention claimed is:

1. A method for automatically tuning an impedance matrix presented, at a given frequency, by m ports of an apparatus, where m is an integer greater than or equal to 2, each of said m ports being referred to as user port, the apparatus having said m user ports and n other ports, where n is an integer greater than or equal to 2, each of said n other ports being referred to as target port, said impedance matrix being referred to as the impedance matrix presented by the user ports, the apparatus allowing, at the given frequency, a transfer of power from the user ports to the target ports, the method comprising the steps of:

estimating q real quantities depending on the impedance matrix presented by the user ports, where q is an integer greater than or equal to m, using m or more different excitations applied successively to the user ports;

using said q real quantities depending on the impedance matrix presented by the user ports, to obtain tuning control signals;

adjusting the impedance matrix presented by the user ports using a multiple-input-port and multiple-output-port tuning unit, the multiple-input-port and multiple-output-port tuning unit comprising p adjustable impedance devices, where p is an integer greater than or equal to 2m, each of the adjustable impedance devices having a reactance at the given frequency, the reactance of any one of the adjustable impedance devices having an influence on the impedance matrix presented by the user ports, the reactance of any one of the adjustable impedance devices being adjustable by electrical means;

applying each of the tuning control signals to one or more of the adjustable impedance devices, the reactance of each of the adjustable impedance devices being mainly determined by one or more of the tuning control signals.

2. The method of claim 1, wherein any diagonal entry of the impedance matrix presented by the user ports is influenced by the reactance of at least one of the adjustable impedance devices.

3. The method of claim 2, wherein the reactance of at least one of the adjustable impedance devices has an influence on at least one non-diagonal entry of the impedance matrix presented by the user ports.

4. The method of claim 1, wherein n=m, and wherein the multiple-input-port and multiple-output-port tuning unit is composed of n single-input-port and single-output-port tuning units each comprising two or more of said adjustable impedance devices.

5. An apparatus for automatically tuning an impedance matrix presented, at a given frequency, by m ports of the apparatus, where m is an integer greater than or equal to 2, each of said m ports being referred to as user port, the apparatus having said m user ports and n other ports, where n is an integer greater than or equal to 2, each of said n other ports being referred to as target port, said impedance matrix being referred to as the impedance matrix presented by the user ports, the apparatus allowing, at the given frequency, a transfer of power from the user ports to the target ports, the apparatus comprising:
- at least m sensing units, each of the sensing units delivering one or more sensing unit output signals, each of the sensing unit output signals being mainly determined by one or more electrical variables;
- a signal processing unit, the signal processing unit estimating q real quantities depending on the impedance matrix presented by the user ports, where q is an integer greater than or equal to m, using the sensing unit output signals obtained for m or more different excitations applied successively to the user ports, the signal processing unit delivering a tuning instruction as a function of said q real quantities depending on the impedance matrix presented by the user ports;
- a multiple-input-port and multiple-output-port tuning unit, the multiple-input-port and multiple-output-port tuning unit comprising p adjustable impedance devices, where p is an integer greater than or equal to 2m, each of the adjustable impedance devices having a reactance at the given frequency, the reactance of any one of the adjustable impedance devices having an influence on the impedance matrix presented by the user ports, the reactance of any one of the adjustable impedance devices being adjustable by electrical means;
- a tuning control unit, the tuning control unit receiving the tuning instruction from the signal processing unit, the tuning control unit delivering tuning control signals to the multiple-input-port and multiple-output-port tuning unit, the tuning control signals being determined as a function of the tuning instruction, the reactance of each of the adjustable impedance devices being mainly determined by one or more of the tuning control signals.

6. The apparatus of claim 5, wherein the sensing unit output signals delivered by each of the sensing units comprise: a first sensing unit output signal proportional to a first electrical variable, the first electrical variable being a voltage across one of the user ports; and a second sensing unit output signal proportional to a second electrical variable, the second electrical variable being a current flowing in said one of the user ports.

7. The apparatus of claim 5, wherein the sensing unit output signals delivered by each of the sensing units comprise: a first sensing unit output signal proportional to a first electrical variable, the first electrical variable being an incident voltage at one of the user ports; and a second sensing unit output signal proportional to a second electrical variable, the second electrical variable being a reflected voltage at said one of the user ports.

8. The apparatus of claim 5, wherein the tuning instruction is such that the impedance matrix presented by the user ports is substantially equal to a wanted impedance matrix.

9. The apparatus of claim 5, wherein the multiple-input-port and multiple-output-port tuning unit is such that, at the given frequency, there exists a diagonal impedance matrix referred to as the given diagonal impedance matrix, the given diagonal impedance matrix being such that, if an impedance matrix seen by the target ports is equal to the given diagonal impedance matrix, then the reactance of any one of the adjustable impedance devices has an influence on the impedance matrix presented by the user ports.

10. The apparatus of claim 9, wherein the multiple-input-port and multiple-output-port tuning unit is such that, at the given frequency, if the impedance matrix seen by the target ports is equal to the given diagonal impedance matrix, then the reactance of at least one of the adjustable impedance devices has an influence on at least one non-diagonal entry of the impedance matrix presented by the user ports.

11. The apparatus of claim 5, wherein n=m, and wherein the multiple-input-port and multiple-output-port tuning unit is composed of n single-input-port and single-output-port tuning units each comprising two or more of said adjustable impedance devices.

12. A transmitter for radio communication with a plurality of antennas in a given frequency band, comprising:
- n antenna output ports, where n is an integer greater than or equal to 2;
- m power amplifiers, where m is an integer greater than or equal to 2, each of the power amplifiers having an output port, each of the power amplifiers being able to deliver a power in the given frequency band, a part of said power being transferred to the antenna output ports, the output ports of the power amplifiers seeing, at a frequency in the given frequency band, an impedance matrix referred to as the impedance matrix seen by the output ports of the power amplifiers, the impedance matrix seen by the output ports of the power amplifiers being a complex matrix of size m×m;
- at least m sensing units, each of the sensing units delivering one or more sensing unit output signals, each of the sensing unit output signals being mainly determined by one or more electrical variables;
- a signal processing unit, the signal processing unit estimating q real quantities depending on the impedance matrix seen by the output ports of the power amplifiers, where q is an integer greater than or equal to m, using the sensing unit output signals obtained for m or more different excitations applied successively by the power amplifiers at the output ports of the power amplifiers, the signal processing unit delivering a tuning instruction as a function of said q real quantities depending on the impedance matrix seen by the output ports of the power amplifiers;
- a multiple-input-port and multiple-output-port tuning unit, the multiple-input-port and multiple-output-port tuning unit comprising p adjustable impedance devices, where p is an integer greater than or equal to 2m, each of the adjustable impedance devices having a reactance at said frequency in the given frequency band, the reactance of any one of the adjustable impedance devices having an influence on the impedance matrix seen by the output ports of the power amplifiers, the reactance of any one of the adjustable impedance devices being adjustable by electrical means;
- a tuning control unit, the tuning control unit receiving the tuning instruction from the signal processing unit, the tuning control unit delivering tuning control signals to the multiple-input-port and multiple-output-port tuning unit, the tuning control signals being determined as a function of the tuning instruction, the reactance of each of the adjustable impedance devices being mainly determined by one or more of the tuning control signals.

13. The transmitter of claim 12, wherein the sensing unit output signals delivered by each of the sensing units comprise: a first sensing unit output signal proportional to a first electrical variable, the first electrical variable being a voltage across one of the output ports of the power amplifiers; and a second sensing unit output signal proportional to a second electrical variable, the second electrical variable being a current flowing in said one of the output ports of the power amplifiers.

14. The transmitter of claim 12, wherein the sensing unit output signals delivered by each of the sensing units comprise: a first sensing unit output signal proportional to a first electrical variable, the first electrical variable being an incident voltage at one of the output ports of the power amplifiers; and a second sensing unit output signal proportional to a second electrical variable, the second electrical variable being a reflected voltage at said one of the output ports of the power amplifiers.

15. The transmitter of claim 12, wherein the tuning instruction is such that the impedance matrix seen by the output ports of the power amplifiers is substantially equal to a wanted impedance matrix.

16. The transmitter of claim 12, wherein any diagonal entry of the impedance matrix seen by the output ports of the power amplifiers is influenced by the reactance of at least one of the adjustable impedance devices.

17. The transmitter of claim 16, wherein the reactance of at least one of the adjustable impedance devices has an influence on at least one non-diagonal entry of the impedance matrix seen by the output ports of the power amplifiers.

18. The transmitter of claim 12, wherein n=m, and wherein the multiple-input-port and multiple-output-port tuning unit is composed of n single-input-port and single-output-port tuning units each comprising two or more of said adjustable impedance devices.

* * * * *